(12) United States Patent
Chiu

(10) Patent No.: US 6,218,884 B1
(45) Date of Patent: Apr. 17, 2001

(54) CANCELLATION OF $R_{ON}$ RESISTANCE FOR SWITCHING TRANSISTOR IN LVDS DRIVER OUTPUT

(75) Inventor: Kwok Fu Chiu, San Jose, CA (US)

(73) Assignee: National Semiconductor Corp., Santa Claram, CA (US)

( * ) Notice: Subject to any disclaimer, the term of this patent is extended or adjusted under 35 U.S.C. 154(b) by 0 days.

(21) Appl. No.: 09/517,805

(22) Filed: Mar. 2, 2000

(51) Int. Cl.$^7$ .................................................. H03K 17/04
(52) U.S. Cl. .................. 327/376; 327/108; 327/436
(58) Field of Search ....................... 327/108–112, 374, 327/376, 427, 436, 437

(56) References Cited

U.S. PATENT DOCUMENTS

| | | | |
|---|---|---|---|
| 5,510,729 | 4/1996 | Reymond | 326/33 |
| 5,581,197 | 12/1996 | Motley et al. | 326/30 |
| 5,686,853 | * 11/1997 | Iima et al. | 327/374 |

* cited by examiner

*Primary Examiner*—Kenneth B. Wells
(74) *Attorney, Agent, or Firm*—Stallman & Pollock LLP

(57) ABSTRACT

An apparatus including a low voltage differential signaling (LVDS) driver circuit with on-resistance cancellation, includes a current steering circuit having an on-resistance. In order to cancel the on-resistance of the current steering circuit, the LVDS driver circuit also includes a current proportional to absolute temperature current source, a transistor having an on-resistance proportional to the on-resistance of the current steering circuit, and a voltage-to-current conversion circuit coupled to the transistor, wherein the voltage-to-current conversion circuit converts the drain-to-source voltage of the transistor into a current proportional to an output current of the LVDS driver circuit. A first resistive circuit receives the current proportional to absolute temperature and the current proportional to an output current of the LVDS driver circuit and in accordance therewith provides a first reference signal. This first reference signal is received by a voltage generating circuit which generates two reference voltage signals that are supplied to the current steering circuit.

14 Claims, 4 Drawing Sheets

CANCELLATION OF $R_{ON}$ RESISTANCE FOR SWITCHING TRANSISTOR IN LVDS DRIVER OUTPUT

BACKGROUND OF THE INVENTION

1. Field of the Invention

The present invention relates to low voltage differential swing driver circuits and more particularly, to cancellation of $R_{ON}$ resistance for a switching transistor in LVDS driver circuits.

2. Description of the Related Art

The constant need to transfer more information faster, accompanied by increases in data processing capability, has necessitated an expansion to data transfer rates considerably higher than what was previously possible. As a consequence, a protocol referred to as 100 Base-T was developed for extending IEEE Standard 802.3 to accommodate data moving at an effective transfer rate of 100 Mbps through twisted-pair cables. Under the 100 Base-T protocol, certain control bits are incorporated into the data before it is placed on a twisted-pair cable. The result is that the data and control signals actually move through a twisted-pair cable at 125 Mbps.

One type of data transmission is differential data transmission in which the difference in voltage levels between two signal lines form the transmitted signal. Differential data transmission is commonly used for data transmission rates greater than 100 Mbps over long distances. Noise signals shift the ground level voltage and appear as common mode voltages. Thus, the deleterious effects of noise are substantially reduced.

To standardize such data transmission various standards have been promulgated. For example, one such standard is the recommended standard 422, RS422, which is defined by the Electronics Industry of America, EIA. This standard permits data rates up to 10 million baud over a twisted pair of signal lines. Driver circuits place signals on the lines. These drivers circuits must be capable of transmitting a minimum differential signal in the range of two to three volts on the twisted pair line which typically terminates in 100 ohms of resistance.

One problem with RS422 is that the twisted line pair is often used as a bus to which multiple driver circuits, sources of signals, are attached. In one type of conventional circuit, when multiple drivers are connected to a common bus, only one driver may transmit data at a time. The remaining drivers should be in a high impedance state so as to not load the bus. Since large positive and negative common mode signals may appear at the driver output terminals connected to a bus system, the maintenance of a high impedance over a wide common mode voltage range independent of whether the driver is powered or not, is desirable.

An example of a conventional low voltage differential swing (LVDS) driver circuit 100 is shown in FIG. 1. The difference in voltage between the output signals OUT+, OUT− on the output terminals 103, 105 form the pair of differential signals. A pair of differential signals means two signals whose current waveforms are out of phase with one another. The individual signals of a pair of differential signals are indicated by reference symbols respectively ending with "+" and "−" notation, e.g., S+ and S−. The composite notation "+/−" is employed to indicate both differential signals using a single reference symbol, e.g., S+/−.

The LVDS driver circuit 100 includes a resistor R1 coupled to a reference voltage VREF, four n-channel metal oxide semiconductor (NMOS) switches M11–M14, and a resistor R2 coupled between the common node COM and voltage supply VSS. The four transistor switches M11–M14 are controlled by input voltage signals VIN1, VIN2 and direct current through load resistor RL as indicated by arrows A and B. The input voltage signals VIN1, VIN2 are typically rail-to-rail voltage swings.

The gates of NMOS switches M11 and M14 are coupled together to receive input voltage signal VIN1. Similarly, the gates of NMOS switches M12 and M13 are coupled together to receive input voltage signal VIN2.

Operation of the LVDS driver circuit 100 is explained as follows. Two of the four NMOS switches M11–M14 turn on at a time to steer current from resistor R1 to generate a voltage across resistive load RL. To steer current through resistive load RL in the direction indicated by arrow A, input signal VIN1 goes high turning ON NMOS switches M11 and M14. When input signal VIN1 goes high, input signal VIN2 goes low to keep NMOS switches M12 and M13 OFF during the time NMOS switches M11 and M14 are ON. Conversely, to steer current through resistive load RL in the direction indicated by arrow B, input signal VIN2 goes high and is applied to transistor switches M12 and M13 to make them conduct. Input signal VIN1 goes low to keep NMOS switches M11 and M14 OFF during this time. As a result, a full differential output voltage swing can be achieved.

When MOS transistors are used as switches in semiconductor manufacturing, such as in LVDS driver circuit 100, the on resistance $R_{ON}$ of the transistor becomes a significant factor. The on resistance of a MOS transistor is determined by:

$$RON = \frac{VDS}{ID} \tag{1}$$

where VDS is the drain to source voltage and ID is the drain current of the MOS transistor. In addition, $$\frac{VDS}{ID} = \frac{1}{KP\left(\frac{W}{L}\right)\left(VGS - VT - \frac{VDS}{2}\right)} \tag{2}$$

where KP is a constant, W/L is the ratio of the width (W) and length (L) of the MOS transistor, VGS is the gate-to-source voltage of the MOS transistor, and VT is the threshold voltage needed to turn the MOS transistor ON. This equation is approximately equal to (assume VGS−VT>>VDS/2):

$$\frac{VDS}{ID} \approx \frac{1}{KP\left(\frac{W}{L}\right)(VGS - VT)} \tag{3}$$

Thus, the on resistance $R_{ON}$ of MOS transistor depends upon KP and VT which are both process sensitive, and VGS which depends upon the supply voltage VDD and is, thus, application dependent.

Referring again to FIG. 1, the current IL through resistor RL is:

$$IL = \frac{VREF}{RON1 + RON2 + R1 + R2 + RL} \tag{4}$$

where $R_{ON1}$ is the on resistance of one of the MOS transistors M11 or M12, depending upon which of the two transistors M11, M12 is ON; where $R_{ON2}$ is the resistance of one of the MOS transistors M13 or M14 depending upon which of the two transistors M13, M14 is ON; and where R1, R2 and RL are the resistance of resistors R1, R2, and RL respectively. Reference voltage VREF can be generated from bandgap voltage such that it is process and temperature independent. Based on equation (4), it can be seen that current IL depends on resistances $R_{ON}$, R1, R2 and RL.

The use of resistances R1 and R2 can result in less variation in current IL due to the on-resistance $R_{ON}$ of MOS transistors. However, the values of resistors R1 and R2 become dominant variables since they can vary in a range of +/−20% typically in semiconductor manufacturing.

Therefore, a need exists for a circuit that can make the current IL through resistor RL independent of the on-resistance $R_{ON}$ of MOS transistors.

SUMMARY OF INVENTION

A low voltage differential signaling ("LVDS") driver circuit with on-resistance cancellation in accordance with the present invention includes a current steering circuit, an on-resistance cancellation bias circuit and a first resistive circuit. The on-resistance cancellation bias circuit includes a current proportional to absolute temperature current source, a transistor having an on-resistance proportional to the on-resistance of the current steering circuit, a voltage-to current conversion circuit which converts the drain-to-source voltage across the transistor to a current proportional to an output current of the LVDS driver circuit, and a second resistive circuit that receives the current proportional to absolute temperature and the current proportional to an output current of the LVDS driver circuit and in accordance therewith provides a first reference signal. This first reference signal is received by the voltage generating circuit which generates two reference voltage signals that are supplied to the current steering circuit.

In an embodiment of the present invention, the voltage-to-current conversion circuit includes a resistive circuit coupled between the outputs of two buffer circuits and a current source coupled to the resistive circuit, such that the voltage drop across the resistive circuit is equivalent to the voltage drop across the transistor.

In an alternate embodiment of the present invention first and second buffer circuits couple to the first resistive circuit at first and second nodes having a resistance therebetween, and a third buffer circuit couples between the second resistive circuit of the voltage-to-current conversion circuit and the first resistive circuit. The configuration of the present invention eliminates resistors R1 and R2 of the conventional LVDS driver circuit which can vary markedly. In addition, the output voltage signal of the present invention does not depend upon the on-resistance of the switching circuit or on the resistive load, which can also vary markedly. Thus, with the configuration of the present invention the output voltage Vout of the LVDS driver circuit with on-resistance cancellation remains constant even if there are variations in the value of resistive load RL, in the supply voltage, temperature, or fabrication process parameters.

These and other features and advantages of the present invention will be understood upon consideration of the following detailed description of the invention and the accompanying drawings.

DETAILED DESCRIPTION OF THE INVENTION

Figure 2:
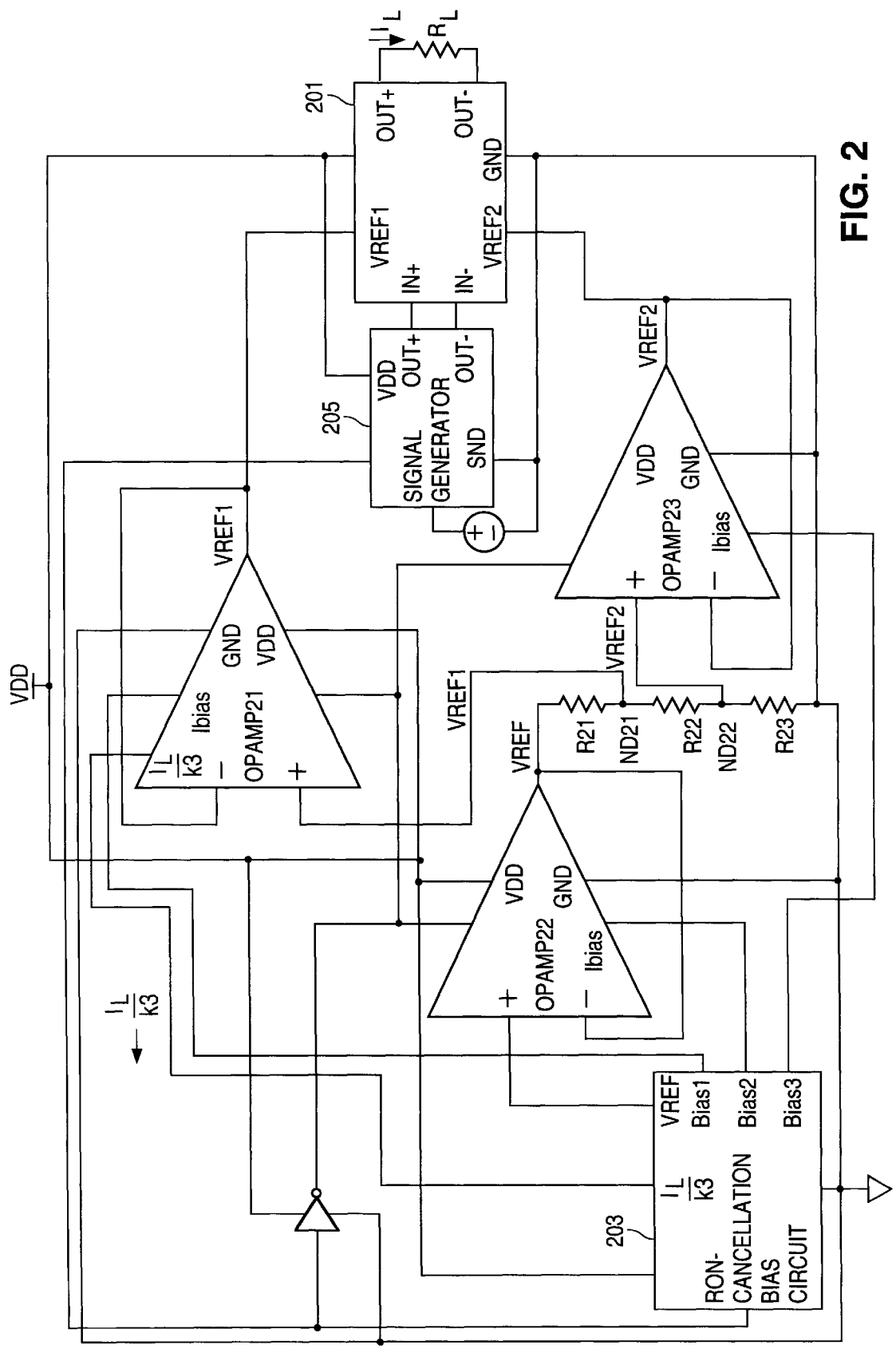
FIG. 2 illustrates a low voltage differential signal driver circuit in accordance with one embodiment of the present invention.

In accordance with an illustrative embodiment of the invention, FIG. 2 illustrates an LVDS driver with $R_{ON}$ cancellation circuit 200. As shown, the LVDS driver circuit 200 includes a switching circuit 201, three operational amplifiers OPAMP21–OPAMP23, and an $R_{ON}$ cancellation bias circuit 203 to generate a differential voltage swing across a resistive load RL, typically external to the chip on which is the LVDS driver with $R_{ON}$ cancellation circuit 200.

It will be appreciated that operational amplifiers OPAMP21–OPAMP23 are buffers and although they are desirable, they are not necessary for the intended operation on the LVDS driver with $R_{ON}$ cancellation circuit 200 in accordance with the present invention. These operational amplifiers OPAMP21–OPAMP23 are shown in the figures and discussed below for exemplary purposes only.

Referring again to FIG. 2, operational amplifier OPAMP21 couples to switching circuit 201 and to $R_{ON}$ cancellation circuit 203 to provide a reference voltage VREF1 to switching circuit 201 and to provide current IL/$k_3$ to $R_{ON}$ cancellation circuit 203, where $k_3$ is a constant and where current IL/$k_3$ is a fraction of the output current IL through resistive load RL.

Figure 1:
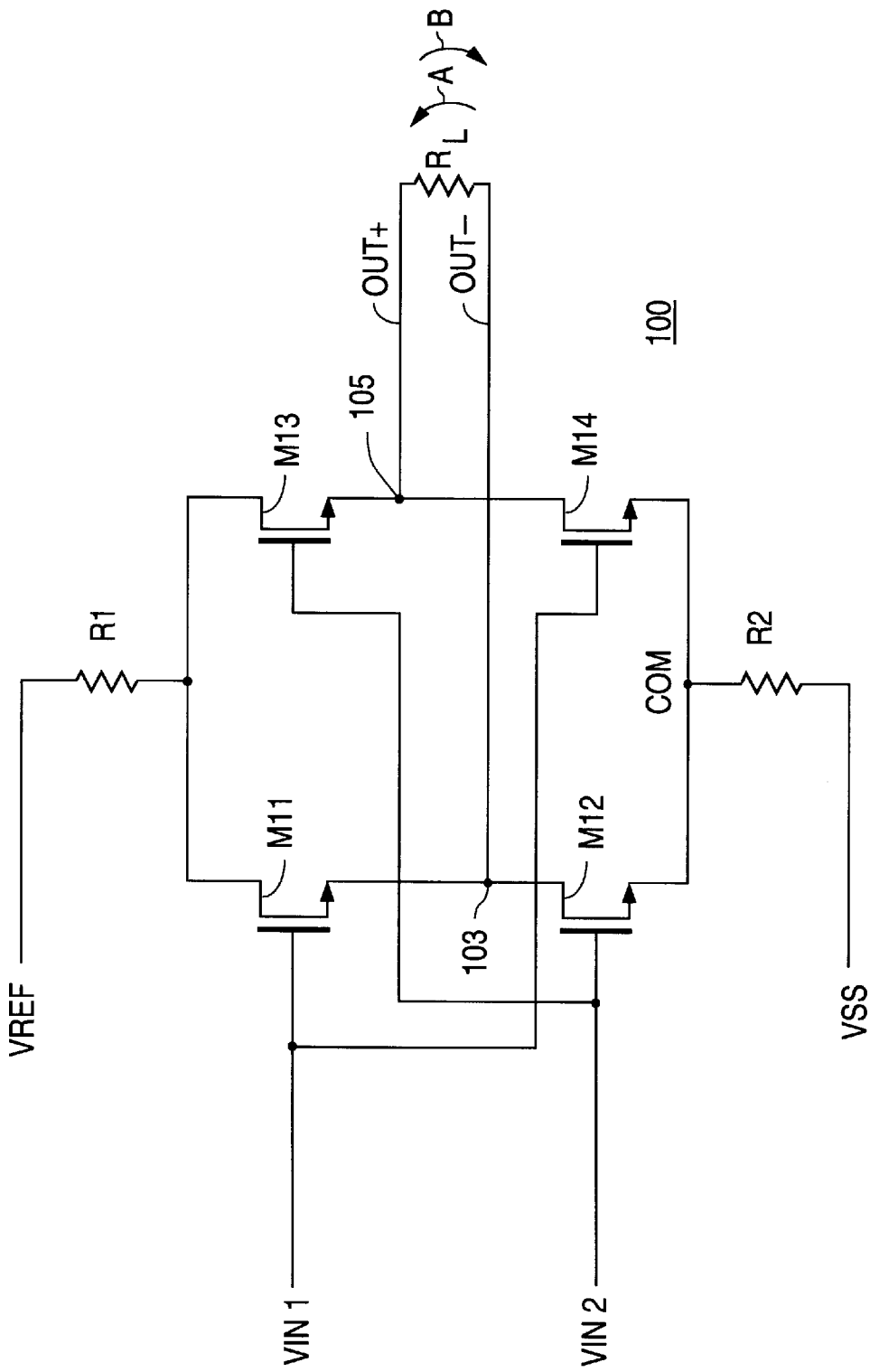
FIG. 1 illustrates a conventional low voltage differential swing circuit.
Figure 3:
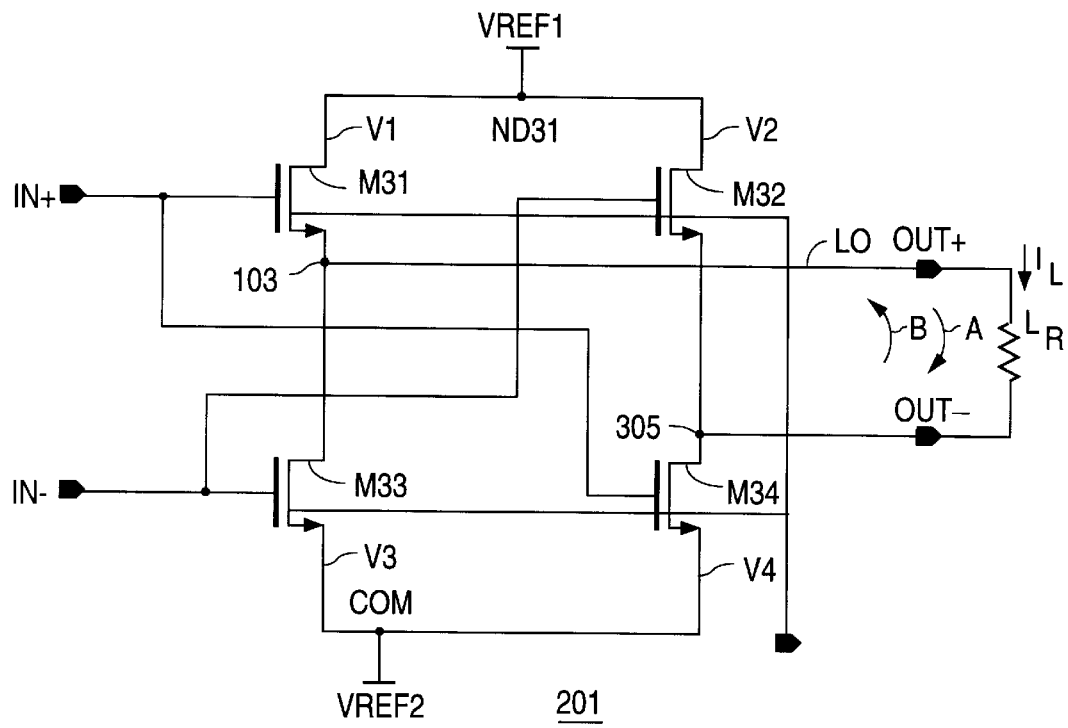
FIG. 3 illustrates a switching circuit of a low voltage differential signal driver circuit in accordance with another embodiment of the present invention.

A more detailed schematic of switching circuit 201 is illustrated in FIG. 3. The circuit 201 has a modified typical H-bridge configuration coupled between a first reference voltage VREF1 and a second reference voltage VREF2, rather than between resistors coupled to voltage supplies VDD and GND as in conventional LVDS driver circuit 100 illustrated in FIG. 1. A load segment LO extends horizontally and contains resistive load RL. This load segment LO couples between end nodes 303, 305. Vertical segment V1 extends between left end node 303 and node ND31. Connected between left end node 303 and common node COM is vertical segment V3. Vertical segment V2 extends between right end node 305 and node ND31, while vertical segment V4 extends between right end node 305 and common node COM. The reference to "vertical" and "horizontal" orientations of the segments of the modified H-bridge circuit 201 are, of course, merely for descriptive purposes and do not necessarily describe the actual layout of the circuit 201. Each of the vertical segments V1, V2, V3, V4 contains a respective NMOS switch M31, M32, M33, M34.

The switches M31–M34 are controlled by input signals IN+, IN− from signal generator 205 illustrated in FIG. 2. These input signals IN+, IN− are complementary rail to rail voltage levels so the signal is either "high" or "low." In operation, these voltage signals IN+, IN− are applied to the gates of transistors M31–M34, to direct current from reference voltage VREF1 through resistive load RL as indicated by arrows A and B. As used herein, the term "gate" broadly encompasses any form of control lead for changing the switching state of a device. As such, the term "gate" is intended to be synonymous with the "base" of a bipolar transistor, for example.

To steer the current from reference voltage VREF1 through load resistor RL in the direction indicated by arrow A, a high voltage level from voltage signal IN+ is applied to MOS switches M31 and M34 to turn these switches on, while a low voltage level from voltage signal IN− is applied to MOS switches M32 and M33 to keep these switches off during this time. When switching circuit 201 steers the current in this direction, the voltage at output node 305 is pulled low and the voltage at the output node 303 is pulled high. Thus, since output transistor M31 is ON, the high output voltage VOH is the voltage at output node 303 and the output low voltage VOL is the voltage at output node 305.

Conversely, to direct current through resistive load RL in the direction indicated by arrow B, a high voltage level from voltage signal IN− is applied to MOS switches M32 and M33 to make them conduct, while the other switches M31 and M34 are kept off during this time. When switching circuit 201 steers the current in this direction, the voltage at output node 305 is pulled high and the voltage at the output node 303 is pulled low. Thus, since output transistor M33 is ON, the high output voltage VOH is the voltage at output node 305 and output low voltage VOL is the voltage at output node 303.

By using a configuration that eliminates resistors R11 and R12 of LVDS driver circuit 100 there is no dependency on the resistance of such resistors to cause variations in the driver circuit. Thus, the current IL through resistive load RL is:

$$I_L = \frac{V_{REF1} - V_{REF2}}{R_{ON1} + R_{ON2} + R_L} \tag{5}$$

where $R_{ON1}$ is the on resistance of one of the MOS transistors M31 or M32, depending upon which of the two transistors M31, M32 is ON; where $R_{ON2}$ is the on resistance of one of the MOS transistors M33 or M34 depending upon which of the two transistors M33, M34 is ON; and where RL is the resistance of resistive load RL. Combining the on resistances $R_{ON1}$ and $R_{ON2}$ of the two MOS transistors that are on, equation (5) simplifies to:

$$I_L = \frac{V_{REF1} - V_{REF2}}{R_{ON} + R_L} \tag{6}$$

where $R_{ON}$ equals a sum of on resistances $R_{ON1}$ and $R_{ON2}$.

Since the transistors may be subject to a different voltage supply VDD and variations in temperature and semiconductor chip processing parameters, the on resistance of different transistors may vary significantly. The result of the varying on resistances of the driver transistors M31–M34 is that the output voltage of LVDS circuit 200 is poorly defined, resulting in a degradation in performance of the LVDS circuit 200.

Thus, referring to equation (6), it is desirable to make the current IL independent of the on resistance of MOS transistors M31–M34. If the difference between reference voltages VREF1 and VREF2 is set to be proportional to two components, one being a fixed reference (bandgap reference) and the other being proportional to $R_{ON}I_L$, then the following equation is obtained:

$$V_{REF1} - V_{REF2} = k_1 Vbg + k_2 R_{ON} I_L \tag{7}$$

where $k_1$ and $k_2$ are constants; where the first component ($k_1 Vbg$) is a bandgap reference voltage; and where the second component ($k_2 R_{ON} I_L$) is the combined drain-to-source voltage Vds of the two switching transistors that are on. Then, substituting equation (7) into equation (6) provides:

$$I_L = \frac{k_1 Vbg + k_2 R_{ON} I_L}{R_{ON} + R_L} \tag{8}$$

Simplifying equation (8) yields:

$$I_L(R_{ON} + R_L) = k_1 Vbg + k_2 R_{ON} I_L$$

$$I_L(R_{ON} + R_L - k_2 R_{ON}) = k_1 Vbg$$

$$I_L = \frac{k_1 Vbg}{R_{ON}(1 - k_2) + R_L} \tag{9}$$

If constant $k_2$ in equation (9) is set equal to 1, then equation (9) simplifies to:

$$I_L = \frac{k_1 Vbg}{R_L} \tag{10}$$

Since the output voltage Vout is equal to IL*RL, then:

$$Vout = I_L * R_L = k_1 * Vbg \tag{11}$$

Equation (11) shows the output voltage Vout has the dependency on constant $k_1$ and bandgap reference voltage Vbg. Since output voltage Vout has no dependency on voltage supply VDD, temperature, resistive load RL, or fabrication process parameters, a stable output voltage Vout can be expected.

In order to achieve equation (11), the second component $k_2 R_{ON} I_L$ of equation (7) must be canceled, i.e., referring to equation (9), constant k2 should equal "1." Referring again to FIG. 2, the circuit configuration of LVDS driver with $R_{ON}$ cancellation circuit 200 is designed to cancel this second component. Thus, compared to the conventional LVDS driver circuit 100 which minimizes effects from the on resistance of the LVDS driver circuit 100 by using resistances R1 and R2, LVDS driver with $R_{ON}$ cancellation circuit 200 eliminates the on resistance $R_{ON}$.

Figure 4:
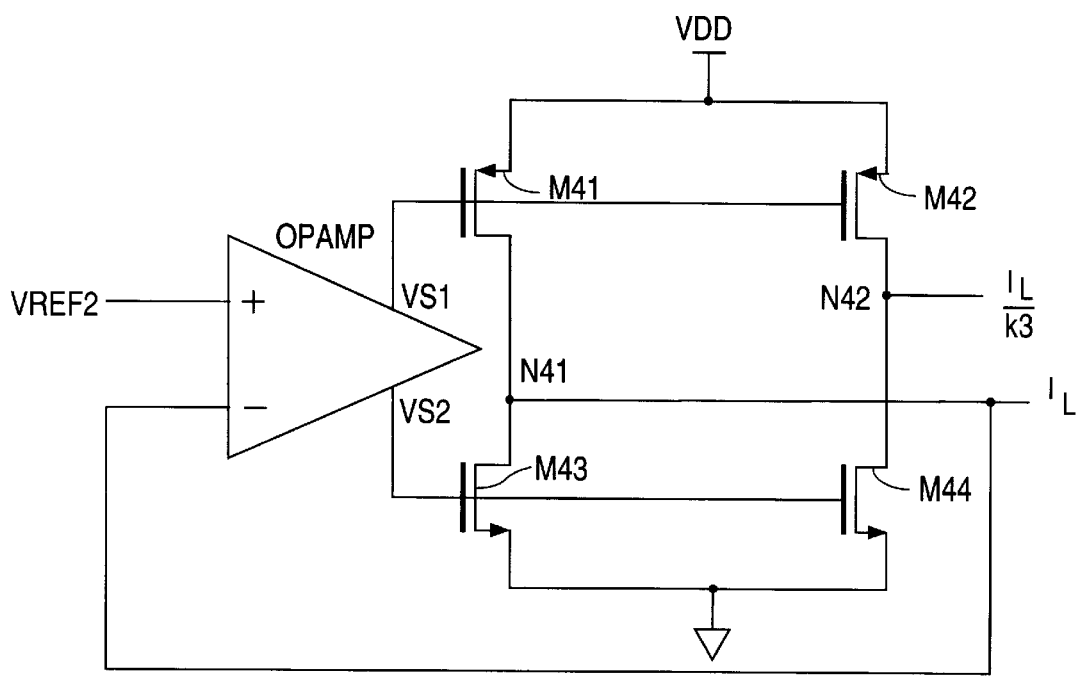
FIG. 4 illustrates a buffer circuit of a low voltage differential signal driver circuit in accordance with still another embodiment of the present invention.

As FIG. 2 illustrates, reference voltage VREF1 is provided by operational amplifier OPAMP21. A more detailed discussion of operational amplifier OPAMP21 will be explained with reference to FIG. 4. Operational amplifier OPAMP is a general operational amplifier without an output stage. Transistors M41 and M43 make up the output driver stage of the operational amplifier OPAMP21 illustrated in FIG. 2. As can be seen, in FIG. 4, reference voltage VREF1 is the non-inverting input and the output is feed back to the inverting input of operational amplifier OPAMP within operational amplifier OPAMP21 of FIG. 2. Thus, the voltage at node N41 in FIG. 4 would follow reference voltage VREF1. Included in operational amplifier OPAMP21 illustrated in FIG. 2 are P-channel MOS (PMOS) transistors M41–M42 and N-channel MOS (NMOS) transistors M43–M44.

The two PMOS transistors M41 and M42 have their sources coupled to voltage supply VDD, their gates coupled to receive a bias signal BIAS1 from operational amplifier OPAMP and their drains coupled to node N41 and node N42, respectively. The two NMOS transistors M43 and M44 have their sources coupled to circuit ground, their gates coupled to receive a bias signal BIAS2 from operational amplifier OPAMP and their drains coupled to node N41 and node N42, respectively. Transistors M41 and M42 have a size ratio of $k_3$:1, where $k_3$ is a constant. Similarly, the size ratio of transistor M43 to transistor M44 is $k_3$:1. Typically, constant $k_3$ is large, such as 50, to lower the overall operating current.

With this buffer configuration, output current IL can sink more current coming from transistor M41. Transistors M42 and M44 are used to generate current based on the output current IL for use in the cancellation of the $R_{ON}I_L$ term in equation (7), which is also the combined drain-to-source voltage VDS of two active switching transistors M31–M34 in switching circuit 201.

In this exemplary embodiment it is preferable to copy a fraction of current IL rather than the entire current IL, to avoid burning extra current and degrading power dissipation of LVDS driver circuit 200. The current $IL/k_3$ is then used to generate the cancellation voltage $k_2R_{ON}I_L$ as utilized in equation (7).

Figure 5:
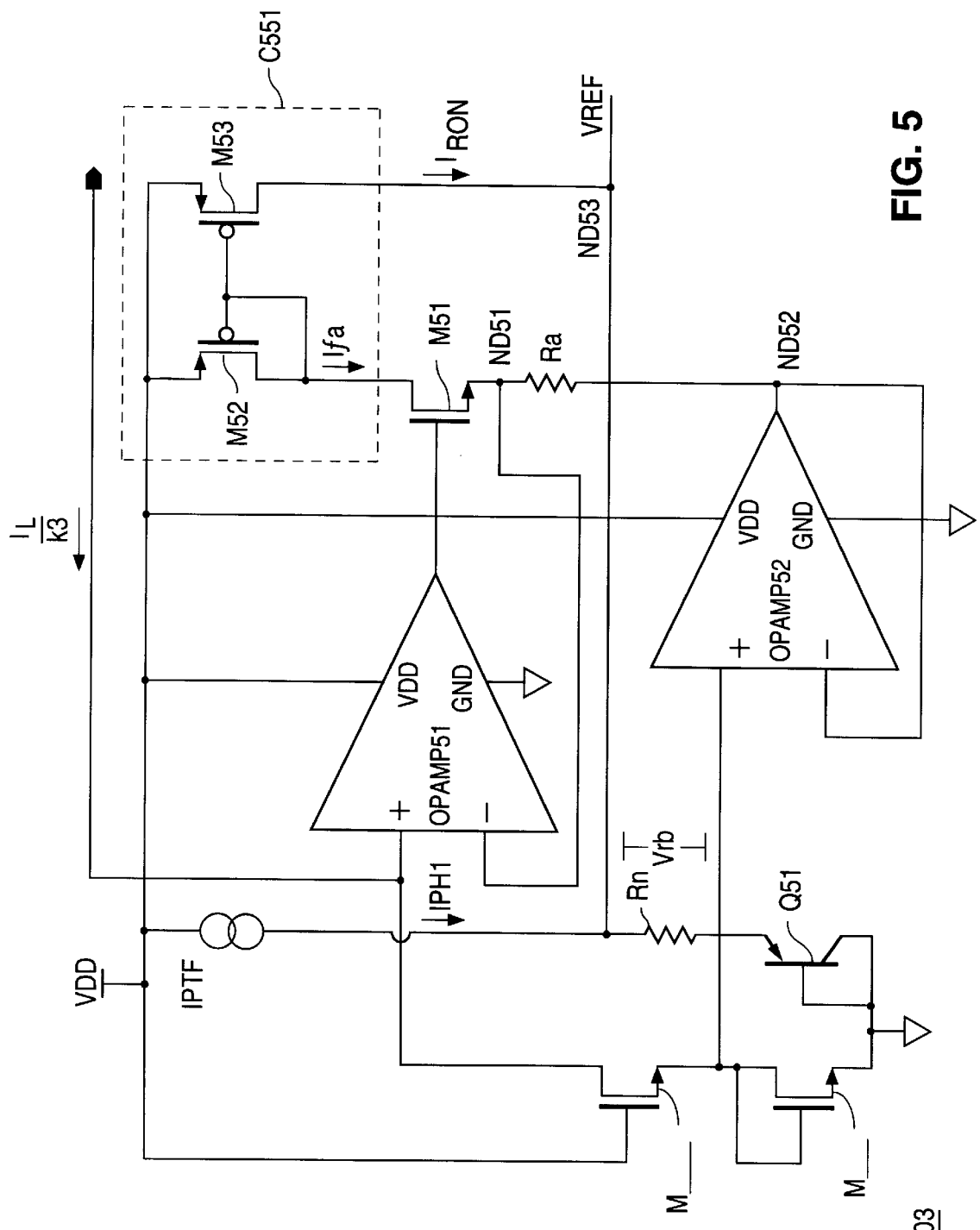
FIG. 5 illustrates a $R_{ON}$ cancellation circuit of a low voltage differential signal driver circuit in accordance with yet another embodiment of the present invention.

Referring again to operational amplifier OPAMP21 illustrated in FIG. 2, it can be seen that current $IL/k_3$ is supplied to $R_{ON}$ cancellation bias circuit 203. A more detailed schematic diagram of $R_{ON}$ cancellation bias circuit 203 is illustrated in FIG. 5. Included in this circuit 203 are transistor $MR_{ON}$ which is a fraction of the size of switching transistors M31 and M34 combined, and which tracks the on resistance of switching transistors M31–M34. Thus, the voltage drop across transistor $MR_{ON}$ or the drain-to-source voltage of transistor $MR_{ON}$, is the same as the voltage drop across switching transistors M31–M34. In the exemplary embodiment illustrated in FIG. 5, transistor $MR_{ON}$ is $1/k_3$ the size of switching transistors M31 and M34 (and M32 and M33) combined.

$R_{ON}$ cancellation bias circuit 203 also includes transistor MCM. The non-inverting input of operational amplifier OPAMP51 couples to the drain of transistor $MR_{ON}$ while the inverting input of operational amplifier OPAMP51 couples to node ND51 between resistor Ra and transistor M51. The non-inverting input of operational amplifier OPAMP52 couples to the source of transistor $MR_{ON}$ while the inverting input and the output couple together and to resistor Ra at node ND52. Current source CS51 mirrors current IRa to provide current IRON, which is proportional to current $IL/k_3$. In this way, operational amplifier OPAMP51, transistor M51, resistor Ra, operational amplifier OPAMP52, and current source CS51 operate as a voltage-to-current conversion circuit to convert the drain-to-source voltage VDS of transistor $MR_{ON}$ into a current IRON which is proportional to the current $IL/k_3$. In particular, operational amplifiers OPAMP51 and OPAMP52 operate as buffers to maintain a voltage across resistor Ra equivalent to the voltage drop across transistor $MR_{ON}$. Current source CS51 then mirrors the current IRa through transistor M51 and resistor Ra to provide an output current IRON.

The drain-to-source voltage VDS of transistor $MR_{ON}$ is determined as follows:

$$V_{DS(MRON)} = k_5 V_{DS(M31+M34)} \quad (12)$$

where k5 is a constant and VDS(M31+M34) is the combined drain-to-source voltage of transistors M31 plus M34. Since the resistance of transistors M31 plus M34 is resistance $R_{ON}$ and the current through transistors M31 and M34 is current IL, $$V_{DS(M31+M34)} = I_L R_{ON} \quad (13)$$

Substituting equation (13) into equation (12) provides:

$$V_{DS(MRON)} = k_5 I_L R_{ON} \quad (14)$$

Transistors M52 and M53 form current mirror current source CS51. The size ratio of transistor M52 to transistor M53 is 1:$k_4$, where $k_4$ is a constant. In this way, output current IRON mirrors the current IRa.

Current IRON is determined by:

$$I_{RON} = k_4 \left( \frac{V_{DS(MRON)}}{Ra} \right) \quad (15)$$

where Ra is the resistance of resistor Ra. Using equation (14) for the drain-to-source voltage VDS($MR_{ON}$) of transistor $MR_{ON}$, provides:

$$I_{RON} = k_4 k_5 \left( \frac{R_{ON} I_L}{Ra} \right) \quad (16)$$

Referring again to FIG. 5, the voltage VRb across resistor Rb is:

$$V_{Rb} = I_{RON} R_b \quad (17)$$

where Rb is the resistance of resistor Rb. Thus, substituting equation (16) in for current IRON provides:

$$V_{Rb} = I_{RON} Rb = k_4 k_5 \left( \frac{Rb}{Ra} \right) R_{ON} I_L \quad (18)$$

Since $k_4$, $k_5$, and Rb/Ra are all geometrical ratios, it can be seen from equation (18) that voltage VRb is proportional to the product of resistance $R_{ON}$ and current IL.

In order to establish a reference voltage VREF at node ND53, a current Proportional To Absolute Temperature (IPTAT) current source couples between voltage supply VDD and node ND53 as illustrated in FIG. 5. In this way, both current IPTAT and current IRON provide current to node ND53 to establish a reference voltage VREF there. In the exemplary embodiment illustrated in FIG. 5, a pnp transistor Q51 couples between resistor Rb and circuit ground.

Referring again to $R_{ON}$ cancellation circuit 203 illustrated in FIG. 2, it can be seen that a voltage generating circuit uses the reference voltage VREF to generate two reference signals VREF1 and VREF2. In the exemplary embodiment illustrated in FIG. 2, such voltage generating circuit includes OPAMP21–OPAMP23 and resistors R21–R23.

To generate reference signals VREF1, VREF2, reference voltage VREF is applied to operational amplifier OPAMP22. The reference voltage VREF is applied to the non-inverting input, while the inverting input and output of the operational amplifier OPAMP22 couple together and to a first resistor R21. A second resistor R22 couples in series to resistor R21, and a third resistor R23 couples in series to R22. A first reference voltage VREF1 is established at node ND21 between resistors R21 and R22, and a second reference voltage VREF2 is established at node ND22 between resistors R22 and R23. These two reference voltages VREF1 and VREF2 are then applied to operational amplifiers OPAMP21 and OPAMP23, respectively, which buffer the reference voltages VREF1, VREF2 before they are applied to switching circuit 201.

Referring again to $R_{ON}$ cancellation circuit 203 illustrated in FIG. 5, reference voltage VREF applied to operational amplifier OPAMP22 is determined as follows:

$$VREF = (I_{PTAT} Rb + V_{BE}) + I_{RON} Rb \quad (19)$$

where VBE is the base-emitter voltage of transistor Q51. Knowing that the first term on the right side of equation (19) is equal to Vbg, i.e., $$Vbg = I_{PTAT}Rb + V_{BE} \quad (20)$$

and substituting equation (18) in for $I_{RON}$, provides:

$$VREF = Vbg + \left(k_4 k_5 \frac{Rb}{Ra}\right) I_L R_{ON} \quad (21)$$

Referring again to FIG. 2, the difference between reference voltages VREF1 and VREF2 is:

$$VREF1 - VREF2 = \frac{R_{22}}{R_{21} + R_{22} + R_{23}} VREF \quad (22)$$

Substituting equation (21) for voltage VREF:

$$VREF1 - VREF2 = \quad (23)$$

$$\frac{R_{22}}{R_{21} + R_{22} + R_{23}} Vbg + \frac{R_{22}}{R_{21} + R_{22} + R_{23}} \left(k_4 k_5 \frac{Rb}{Ra}\right) I_L R_{ON}$$

Referring again to equation (7) where:

$$V_{REF1} - V_{REF2} = k_1 Vbg + k_2 R_{ON} I_L \quad (7)$$

it can be seen tat $$k_1 = \frac{R_{22}}{R_{21} + R_{22} + R_{23}} \text{ and} \quad (24)$$

$$k_2 = \frac{R_{22}}{R_{21} + R_{22} + R_{23}} \left(k_4 k_5 \frac{Rb}{Ra}\right) \quad (25)$$

Then, setting variable $k_2$ equal to 1 by selecting values of R21, R22, R23, Ra, and Rb, provides complete cancellation. Referring to equation (6) again, $$I_L = \frac{V_{REF1} - V_{REF2}}{R_{ON} + R_L} \quad (6)$$

gives:

$$I_L(R_{ON} + R_L) = V_{REF1} - V_{REF2} \quad (26)$$

Then, equating equation (7) and equation (26):

$$I_L(R_{ON} + R_L) = k_1 Vbg + k_2 R_{ON} I_L \quad (27)$$

Equation (27) can be simplified to:

$$V_{out} = I_L R_L = k_1 Vbg + (k_2 - 1) R_{ON} I_L \quad (28)$$

Then, if variable $k_2$ is selected to be 1, by setting appropriate values in equation (25), then equation can be simplified as equation (11):

$$V_{out} = IL * RL = k_1 * Vbg \quad (11)$$

Substituting equation (24) in for $k_1$ provides:

$$V_{out} = I_L R_L = \frac{R_{22}}{R_{21} + R_{22} + R_{23}} Vbg \quad (27)$$

Output voltage Vout is neither dependent upon resistive load RL nor resistors R1 and R2 in conventional LVDS driver circuit 100. Thus, output voltage Vout remains constant even if there are variations in the value of resistive load RL, in supply voltage VDD, temperature, or fabrication process parameters.

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. An apparatus including a low voltage differential signaling (LVDS) driver circuit with on-resistance cancellation, the LVDS driver circuit comprising:
   a current steering circuit having an on-resistance;
   an on-resistance cancellation bias circuit including,
      a transistor having an on-resistance proportional to the on-resistance of the current steering circuit, the transistor having first, second and third terminals,
      a voltage-to-current conversion circuit coupled to the first and second terminals of the transistor, wherein the voltage-to-current conversion circuit converts the drain-to-source voltage of the transistor into a current proportional to an output current of the LVDS driver circuit, and
      a first resistive circuit coupled to the voltage-to-current conversion circuit; and
   a voltage generating circuit coupled to the first resistive circuit and to the current steering circuit.

2. The apparatus of claim 1, wherein the first resistive circuit couples to a current proportional to absolute temperature and to the voltage-to-current conversion circuit at a common node.

3. The apparatus of claim 1, wherein the first resistive circuit couples to a current proportional to absolute temperature, the voltage-to-current conversion circuit, and the voltage generating circuit at a common node.

4. The apparatus of claim 1, wherein the voltage generating circuit comprises a first buffer circuit having a first input coupled to the voltage-to-current conversion circuit and to the first resistive circuit, and having a second input and an output coupled together and to a second resistive circuit.

5. The apparatus of claim 4, wherein the second resistive circuit comprises a plurality of nodes with resistances therebetween, and wherein the current steering circuit couples to the second resistive circuit at first and second nodes of the plurality of nodes.

6. The apparatus of claim 5, wherein the voltage generating circuit further comprises a second buffer circuit having a first input coupled to the first node of the plurality of nodes and having a second input and an output coupled together and to the current steering circuit.

7. The apparatus of claim 5, wherein the voltage generating circuit further comprises:
   a first buffer circuit having a first input coupled to the first node of the plurality of nodes, and having a second input and an output coupled together and to the current steering circuit;
   a second buffer circuit having a first input coupled to the voltage-to-current conversion circuit and to the first resistive circuit, and having a second input and an output coupled together and to the second resistive circuit; and
   a third buffer circuit having a first input coupled to the second node of the plurality of nodes and having a second input and an output coupled together and to the current steering circuit.

8. The apparatus of claim 1, wherein the on-resistance cancellation bias circuit further includes a current proportional to absolute temperature current source coupled to the first resistive circuit.

9. The apparatus of claim 8, wherein first resistive circuit is configured to receive the current proportional to the output current of the LVDS driver circuit and the current proportional to absolute temperature and in accordance therewith provide a first reference signal.

10. The apparatus of claim 1, wherein the voltage generating circuit provides first and second reference signals to the current steering circuit.

11. The apparatus of claim 1, wherein the voltage-to-current conversion circuit comprises:
- a first buffer circuit having a first input coupled to the first terminal of the transistor and having a second input and an output coupled together;
- a second buffer circuit having an input coupled to the second terminal of the transistor and having a second input and an output coupled together;
- a second resistive circuit coupled between the outputs of the first and second buffer circuits; and
- a current source coupled to the output of the first buffer circuit, to the first resistive circuit, and to the second resistive circuit.

12. The apparatus of claim 10, wherein a potential across the second resistive circuit is proportional to a potential across the transistor.

13. An apparatus including a low voltage differential signaling (LVDS) driver circuit with on-resistance cancellation, the LVDS driver circuit comprising:
- a plurality of switching transistors having an on-resistance;
- an on-resistance cancellation bias circuit having,
  - a current proportional to absolute temperature current source,
  - a transistor having a size proportional to a size of the plurality of switching transistors, the transistor having first, second and third terminals,
  - a voltage-to-current conversion circuit coupled to the first and second terminals of the transistor, wherein the voltage-to-current conversion circuit converts the drain-to-source voltage of the transistor into a current proportional to an output current of the LVDS driver circuit, and
  - a first resistive circuit coupled to the current proportional to absolute temperature current source and to the voltage-to-current conversion circuit;
- a first buffer circuit having a first input coupled to the voltage-to-current conversion circuit and to the first resistive circuit, and having a second input and an output coupled together;
- a second resistive circuit coupled to the output of the first buffer circuit, the second resistive circuit comprising a plurality of nodes with resistances therebetween;
- a second buffer circuit having a first input coupled to the first node of the plurality of nodes, and having a second input and an output coupled together and to the current steering circuit;
- a third buffer circuit having a first input coupled to the second node of the plurality of nodes and having a second input and an output coupled together and to the current steering circuit.

14. An apparatus including a low voltage differential signaling (LVDS) driver circuit with on-resistance cancellation, the LVDS driver circuit comprising:
- switching means for switching an input current, said means for switching having an on-resistance;
- receiving means for receiving a first current and in accordance therewith establishing a voltage proportional to the on-resistance of the steering means, wherein the first current is proportional to the output current of the LVDS driver circuit;
- converting means for converting a voltage drop across the receiving means into a second current proportional to the first current;
- first resistive means for receiving a current proportional to absolute temperature and the second current and in accordance therewith providing a first reference signal; and
- second resistive means for receiving the first reference signal and in accordance therewith providing first and second reference signals which are received by the steering means.

* * * * *